(12) United States Patent
Park et al.

(10) Patent No.: US 12,234,400 B2
(45) Date of Patent: Feb. 25, 2025

(54) ETCHANT COMPOSITION FOR ETCHING SILICON GERMANIUM FILM AND METHOD OF MANUFACTURING INTEGRATED CIRCUIT DEVICE BY USING THE SAME

(71) Applicant: SAMSUNG ELECTRONICS CO., LTD., Suwon-si (KR)

(72) Inventors: Changjun Park, Hwaseong-si (KR); Jaesung Lee, Seongnam-si (KR); Junghun Lim, Seongnam-si (KR); Jungmin Oh, Incheon (KR); Sangwon Bae, Suwon-si (KR); Hyosan Lee, Seongnam-si (KR)

(73) Assignees: SAMSUNG ELECTRONICS CO., LTD.; SOULBRAIN, CO., LTD.

( * ) Notice: Subject to any disclaimer, the term of this patent is extended or adjusted under 35 U.S.C. 154(b) by 269 days.

(21) Appl. No.: 18/098,847

(22) Filed: Jan. 19, 2023

(65) Prior Publication Data
US 2023/0272280 A1 Aug. 31, 2023

(30) Foreign Application Priority Data
Feb. 25, 2022 (KR) .................. 10-2022-0025510

(51) Int. Cl.
| | |
|---|---|
| C09K 13/10 | (2006.01) |
| C09K 13/08 | (2006.01) |
| H01L 21/306 | (2006.01) |
| H10B 12/00 | (2023.01) |

(52) U.S. Cl.
CPC .............. *C09K 13/10* (2013.01); *C09K 13/08* (2013.01); *H01L 21/30604* (2013.01); *H10B 12/05* (2023.02); *H10B 12/30* (2023.02)

(58) Field of Classification Search
None
See application file for complete search history.

(56) References Cited

U.S. PATENT DOCUMENTS

| | | |
|---|---|---|
| 10,106,737 B2 | 10/2018 | Dictus et al. |
| 10,475,658 B2 | 11/2019 | Bilodeau et al. |
| 10,879,076 B2 | 12/2020 | Liu et al. |

(Continued)

FOREIGN PATENT DOCUMENTS

| | | |
|---|---|---|
| KR | 10-0652407 B1 | 11/2006 |
| KR | 10-2290209 B1 | 8/2010 |

(Continued)

*Primary Examiner* — Allan W. Olsen
(74) *Attorney, Agent, or Firm* — Muir Patent Law, PLLC

(57) ABSTRACT

An etchant composition for etching a silicon germanium film includes, based on a total weight of the etchant composition, about 5 wt % to about 14 wt % of an oxidant, about 0.01 wt % to about 5 wt % of a fluorine compound, about 0.01 wt % to about 5 wt % of an amine compound, about 0.01 wt % to about 1 wt % of an alcohol compound having a hydrophilic head and a hydrophobic tail, about 60 wt % to about 90 wt % of an organic solvent, and a balance of water. A method of manufacturing an integrated circuit device includes: forming, on a substrate, a structure in which a plurality of silicon films and a plurality of silicon germanium films are alternately stacked; and selectively removing the plurality of silicon germanium films by using the etchant composition.

13 Claims, 15 Drawing Sheets

(56) References Cited

U.S. PATENT DOCUMENTS

| | | | |
|---|---|---|---|
| 10,920,144 B2 | 2/2021 | Bjelopavlic et al. | |
| 10,934,484 B2 | 3/2021 | Liu et al. | |
| 10,957,547 B2 | 3/2021 | Bilodeau et al. | |
| 11,091,696 B2 | 8/2021 | Kim et al. | |
| 2018/0294165 A1 | 10/2018 | Bilodeau | |
| 2019/0085240 A1* | 3/2019 | Liu | H01L 21/31111 |
| 2019/0088492 A1* | 3/2019 | Liu | H01L 21/02381 |
| 2019/0103282 A1 | 4/2019 | Ge et al. | |
| 2020/0079999 A1* | 3/2020 | Kim | H01L 29/78696 |
| 2023/0397392 A1* | 12/2023 | Kaeding | H10B 12/05 |

FOREIGN PATENT DOCUMENTS

| | | |
|---|---|---|
| KR | 10-2017-0034036 A | 3/2018 |
| KR | 10-2018-0107715 A | 10/2018 |
| KR | 10-2018-0110495 A | 10/2018 |
| KR | 10-2019-0022411 A | 3/2019 |
| KR | 10-2019-0122832 A | 10/2019 |
| WO | WO 2021/004759 A1 | 1/2021 |

* cited by examiner

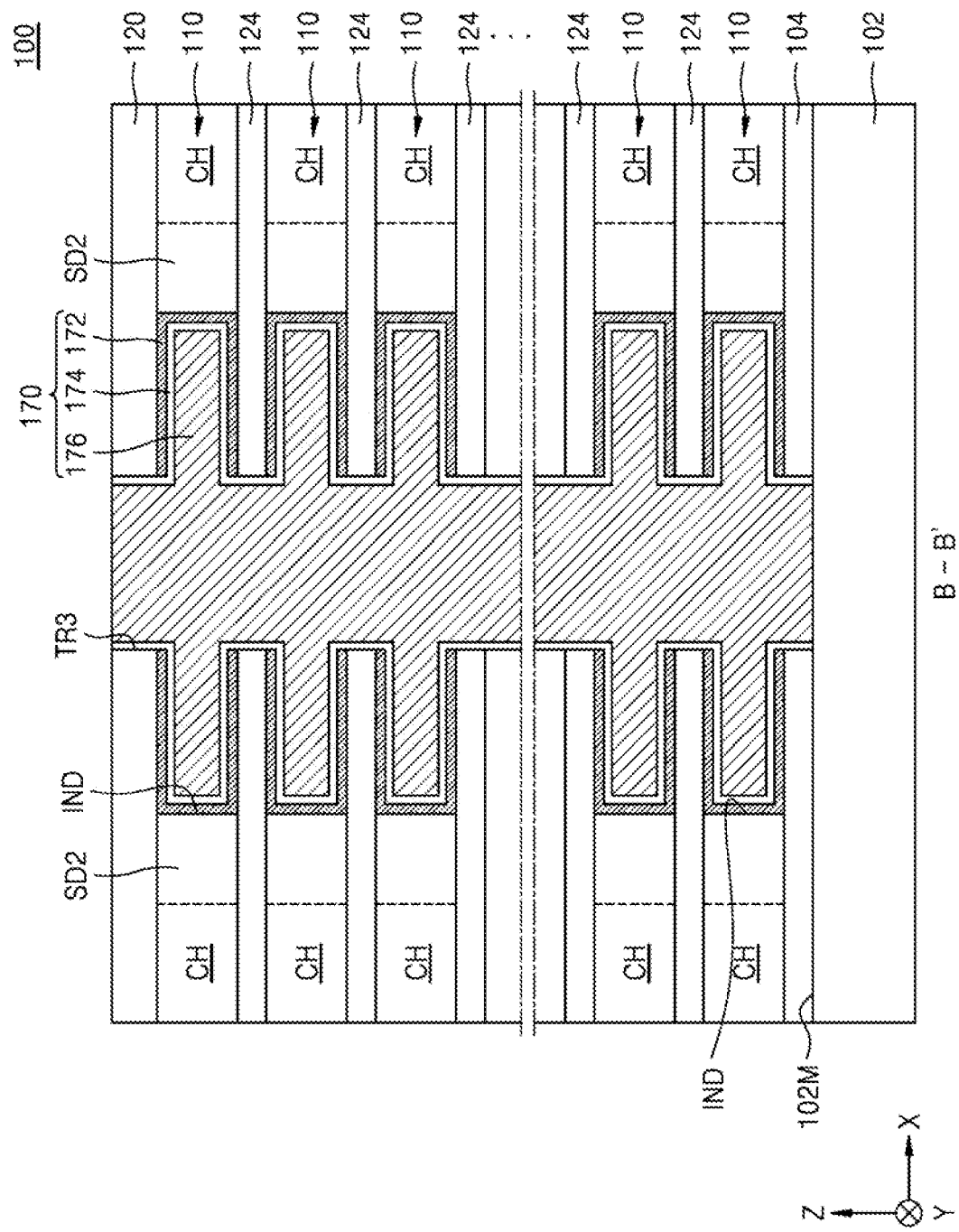

ent composition for selectively etching a silicon germanium film, and a method of manufacturing an integrated circuit device by using the etchant composition.

ETCHANT COMPOSITION FOR ETCHING SILICON GERMANIUM FILM AND METHOD OF MANUFACTURING INTEGRATED CIRCUIT DEVICE BY USING THE SAME

CROSS-REFERENCE TO RELATED APPLICATION

This application is based on and claims priority under 35 U.S.C. § 119 to Korean Patent Application No. 10-2022-0025510, filed on Feb. 25, 2022, in the Korean Intellectual Property Office, the disclosure of which is incorporated by reference herein in its entirety.

BACKGROUND

1. Field

Embodiments relate to an etchant composition and a method of manufacturing an integrated circuit device by using the etchant composition, and more particularly, to an etchant composition for selectively etching a silicon germanium film, and a method of manufacturing an integrated circuit device by using the etchant composition.

2. Description of the Related Art

Due to the advancement of electronics technology, semiconductor devices have been rapidly down-scaled in recent years, and to overcome a limit in improvement of the degree of integration of 2-dimensional semiconductor devices, interest has developed in a 3-dimensional semiconductor memory device in which memory cells are 3-dimensionally arranged.

SUMMARY

An embodiment is directed to an etchant composition for etching a silicon germanium film, the etchant composition including, based on a total weight of the etchant composition, about 5% by weight (wt %) to about 14 wt % of an oxidant, about 0.01 wt % to about 5 wt % of a fluorine compound, about 0.01 wt % to about 5 wt % of an amine compound, about 0.01 wt % to about 1 wt % of an alcohol compound having a hydrophilic head and a hydrophobic tail, about 60 wt % to about 90 wt % of an organic solvent, and a balance of water.

An embodiment is directed to a method of manufacturing an integrated circuit device, the method including: forming, on a substrate, a structure in which a plurality of silicon films and a plurality of silicon germanium films are alternately stacked. The method further includes: selectively removing the plurality of silicon germanium films from among the plurality of silicon films and the plurality of silicon germanium films by using an etchant composition. The etchant composition includes, based on a total weight of the etchant composition, about 5 wt % to about 14 wt % of an oxidant, about 0.01 wt % to about 5 wt % of a fluorine compound, about 0.01 wt % to about 5 wt % of an amine compound, about 0.01 wt % to about 1 wt % of an alcohol compound having a hydrophilic head and a hydrophobic tail, about 60 wt % to about 90 wt % of an organic solvent, and a balance of water.

An embodiment is directed to a method of manufacturing an integrated circuit device, the method including: forming, on a substrate, a mold layer in which a plurality of first silicon films and a plurality of silicon germanium films are alternately stacked. The method further includes: forming an insulating structure to cover a sidewall of the mold layer. The method further includes: forming a mold pattern by forming a trench through anisotropic etching of the plurality of first silicon films and the plurality of silicon germanium films, the mold pattern including respective remaining portions of the plurality of first silicon films and the plurality of silicon germanium films, which define the trench. The method further includes: forming a plurality of air gaps by selectively removing, from the mold pattern, the plurality of silicon germanium films from among the plurality of first silicon films and the plurality of silicon germanium films through the trench by using an etchant composition, the plurality of air gaps exposing the plurality of first silicon films and the insulating structure. The etchant composition includes, based on a total weight of the etchant composition, about 5 wt % to about 14 wt % of an oxidant, about 0.01 wt % to about 5 wt % of a fluorine compound, about 0.01 wt % to about 5 wt % of an amine compound, about 0.01 wt % to about 1 wt % of an alcohol compound having a hydrophilic head and a hydrophobic tail, about 60 wt % to about 90 wt % of an organic solvent, and a balance of water.

BRIEF DESCRIPTION OF THE DRAWINGS

Features will become apparent to those of skill in the art by describing in detail example embodiments with reference to the attached drawings in which:

FIGS. 2A to 8C are diagrams illustrating a method of manufacturing an integrated circuit device according to an example embodiment, and in particular, FIGS. 2A, 3A, 4A, 6A, 7A, and 8A are each a plan view illustrating the method of manufacturing an integrated circuit device, FIG. 2B, FIG. 3B, FIGS. 4B and 5, FIG. 6B, and FIG. 8B are enlarged cross-sectional views of cross-sectional areas, taken along lines A-A' of FIG. 2A, FIG. 3A, FIG. 4A, FIG. 6A, and FIG. 8A, respectively, and FIGS. 7B and 8C are enlarged cross-sectional views taken along lines B-B' of FIGS. 7A and 8A, respectively.

DETAILED DESCRIPTION

Figure 1:
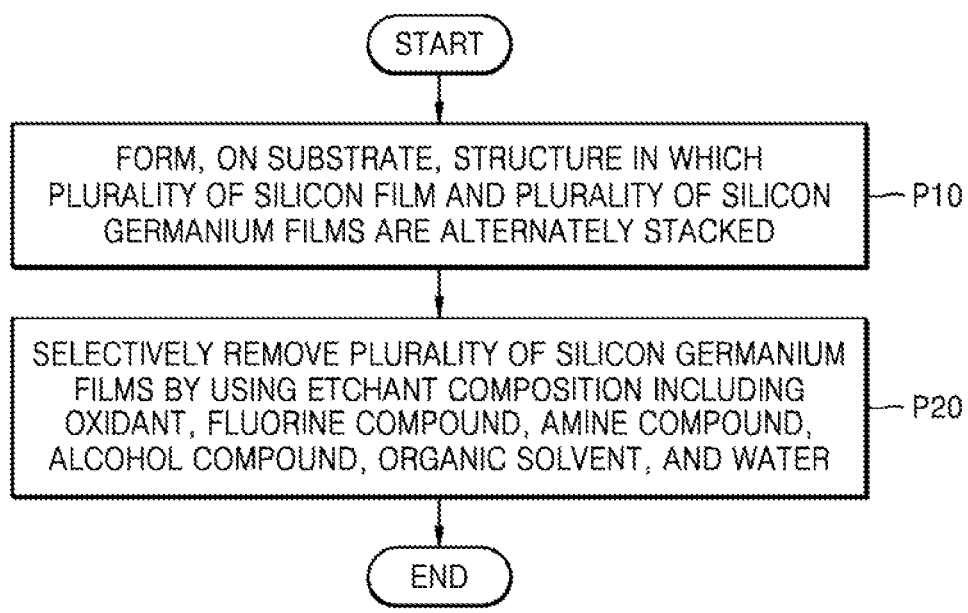
FIG. 1 is a flowchart illustrating a method of manufacturing an integrated circuit device, according to an example embodiment.

An etchant composition according to an example embodiment includes an oxidant, a fluorine compound, an amine compound, an alcohol compound, an organic solvent, and water.

In an example embodiment, based on a total weight of the etchant composition, the oxidant may be present in an amount of about 5 wt % to about 14 wt %, the fluorine compound may be present in an amount of about 0.01 wt % to about 5 wt %, the amine compound may be present in an amount of about 0.01 wt % to about 5 wt %, the alcohol compound may be present in an amount of about 0.01 wt % to about 1 wt %, and the organic solvent may be present in an amount of about 60 wt % to about 90 wt %. Water may be present in the remaining amount excluding the respective amounts of the oxidant, the fluorine compound, the amine compound, the alcohol compound, and the organic solvent.

In an example embodiment, the oxidant may include a C1-C6 carboxylic acid compound, a C1-C6 peroxyacid compound, or a combination thereof. In an example embodiment, the oxidant may include a C1-C3 carboxylic acid compound, a C1-C3 peroxyacid compound, or a combination thereof. For example, the oxidant may include peracetic acid, performic acid, acetic acid, formic acid, propionic acid, or a combination thereof.

In an example embodiment, the fluorine compound may include hydrofluoric acid (HF), sodium fluoride (NaF), potassium fluoride (KF), aluminum fluoride ($AlF_2$), lithium fluoride ($LiF_4$), calcium fluoride ($CaF_3$), sodium hydrogen hexafluoride ($NaHF_6$), ammonium fluoride ($NH_4F$), ammonium difluoride ($NH_4HF_2$), tetramethylammonium fluoride (($CH_3$)$_4$NF), potassium bifluoride ($KHF_2$), fluoroboric acid ($HBF_4$), ammonium tetrafluoroborate ($NH_4BF_4$), potassium fluoroborate ($KBF_4$), hexafluorosilicic acid ($H_2SiF_6$), or a combination thereof.

In an example embodiment, the amine compound may include a C1-C8 aliphatic amine compound, a 5- to 8-membered cyclic amine, or a combination thereof.

In example embodiments, the amine compound may include at least one material selected from ethylamine, isopropylamine, dimethylbutylamine, diisopropylethylamine, and an aliphatic polyamine. The aliphatic polyamine may include an amine compound having at least two amino groups. The aliphatic polyamine may include a polyamine having a linear or branched hydrocarbon group. For example, the aliphatic polyamine may include ethylenediamine, dimethylaminoethylmethylamine, 1,2-propylenediamine, 1,3-propylenediamine, 1,4-butanediamine, 1,3-diaminopentane, hexamethylenediamine, 2-methylpentamethylenediamine, or a combination thereof.

In an example embodiment, the amine compound may include a cyclic amine. The cyclic amine may include pyrrole, oxazole, imidazole, methylimidazole, pyrazole, triazole, aminotriazole, tetrazole, 5-aminotetrazole, methyltetrazole, piperazine, methylpiperazine, hydroxyethylpiperazine, pyrrolidine, alloxan, or a combination thereof.

In an example embodiment, the alcohol compound may have a hydrophilic head and a hydrophobic tail. In an example embodiment, the alcohol compound may be a polyhydric alcohol having at least two hydroxyl groups as the hydrophilic head, and may have a C8-C16 normal alkyl group as the hydrophobic tail.

For example, the alcohol compound may include a diol having the hydrophobic tail or a triol having the hydrophobic tail. For example, the alcohol compound may include a C8-C16 alkane-1,2-diol. For example, the alkane-1,2-diol may include 1,2-octanediol, 1,2-decanediol, 1,2-dodecanediol, 1,2-tetradecanediol, or the like.

The alkane-1,2-diol may have a structure in which hydroxyl groups constituting the hydrophilic head are respectively bonded at positions 1 and 2 of an 8- to 16-carbon chain constituting the hydrophobic tail. Therefore, the hydrophobic tail may be adsorbed on a hydrophobic surface not intended to be etched, e.g., a surface of an Si film, and thus, may protect the Si film. In addition, the hydrophilic head may improve solubility of the alcohol compound in the etchant composition.

In an example embodiment, the organic solvent may include a C1-C5 carboxylic acid compound. In an example embodiment, the organic solvent may include acetic acid, methyl acetate, ethyl acetate, propyl acetate, isopropyl acetate, or a combination thereof. For example, the organic solvent may include acetic acid.

In an example embodiment, in the etchant composition, when the oxidant includes peroxyacid, the etchant composition may further include about 0.01 wt % to about 5 wt % of a catalyst, based on the total weight of the etchant composition. In an example embodiment, a peroxyacid solution may be obtained through an equilibrium reaction between hydrogen peroxide and a carboxylic acid compound in the presence of the catalyst. For example, the catalyst may include sulfuric acid or methanesulfonic acid.

In a structure in which a silicon (Si) film and a silicon germanium (SiGe) film are simultaneously exposed, the etchant composition according to an example embodiment may selectively remove the SiGe film between the Si film and the SiGe film with relatively high etch selectivity.

In particular, as dynamic random-access memory (DRAM) devices have been rapidly down-scaled, to overcome a limit in improvement in the degree of integration of existing 2-dimensional DRAM devices, 3-dimensional DRAM, in which memory cells are 3-dimensionally arranged, has been developed. In 3-dimensional DRAM, a single-crystal silicon film (single-crystal Si film), which facilitates control of leakage current, may be formed as a channel region. To form the single-crystal Si film, a multi-stack structure, in which a plurality of Si films and a plurality of SiGe films are alternately stacked, may be formed on a substrate by an epitaxial growth process. When a Ge concentration in each of the plurality of SiGe films included in the multi-stack structure is relatively high, there is concern that dislocation due to lattice mismatch is generated in the plurality of Si films. To remove the possibility of the generation of dislocation in the plurality of Si films, it may be considered to reduce a germanium content (Ge content) in each of the plurality of SiGe films included in the multi-stack structure. For example, in each of the plurality of SiGe films included in the multi-stack structure, the Ge content may be selected from a range of about 10 atomic % (at %) to about 20 at %. A surface state of an SiGe film having a relatively low Ge content as such may be almost similar to a surface state of an Si film. In a structure including an Si film and also including an SiGe film that has a relatively low Ge content, the etchant composition according to an example embodiment may be used to selectively remove the SiGe film at high etch selectivity to the Si film, even when the Si film and the SiGe film have surface states that are very similar to each other.

In an example embodiment, the oxidant and water included in the etchant composition may act to oxidize the Ge element included in the SiGe film. In an example embodiment, the Ge element included in the SiGe film may be oxidized by the oxidant or water in the etchant composition, and as a result, metagermanic acid ($H_2GeO_3$), which is a soluble material, may be generated. As the Ge element is oxidized at an exposed surface of the SiGe film, the Si element having imperfect bonding at the exposed surface of the SiGe film may be removed through oxidation by the oxidant included in the etchant composition and etching by the fluorine compound included in the etchant composition.

The amine compound included in the etchant composition may function as an etch booster for accelerating the etching of an oxidation resulting product (Ge oxide) of the Ge element, which is oxidized by the oxidant or water, and an oxidation resulting product (Si oxide) of the Si element, which is oxidized by the oxidant. Therefore, the amine compound may increase the etch selectivity of the plurality of SiGe films with respect to the plurality of Si films included in the multi-stack structure. The amine compound may be adsorbed on Ge oxide and Si oxide, which are formed during the process of etching by the etchant composition. Ge oxide and Si oxide, on which the amine compound is adsorbed, may easily and quickly react with fluorine ions. Therefore, the amine compound may help to remove Ge oxide and Si oxide, which are formed during the process of etching by the etchant composition.

The alcohol compound included in the etchant composition according to an example embodiment may protect the Si film while the SiGe film is oxidized by the oxidant and water and etched by the fluorine compound, thereby helping to prevent the Si film from being etched, e.g., to reduce an etch rate thereof. For example, when the alcohol compound includes an alkane-1,2-diol, an end of a carbon chain constituting a hydrophobic tail of the alkane-1,2-diol may be adsorbed on a hydrophobic surface of the Si film by hydrophobic interaction, thereby helping to protecting the Si film. Therefore, the etch selectivity of the SiGe film with respect to the Si film may be increased by the alcohol compound.

In a multi-stack structure in which a plurality of Si films and a plurality of SiGe films are alternately stacked, and in which a Ge content in each of the plurality of SiGe films is about 15 at %, in selectively removing the plurality of SiGe films by using the etchant composition according to an example embodiment, the etch selectivity of the SiGe film with respect to the Si film may be 100 or more.

For example, when an Si film and an SiGe film having a Ge content of about 15 at % are each etched under the same conditions by using the etchant composition according to an example embodiment, an etch rate of the Si film may be less than 1 Å/min, and an etch rate of the SiGe film may be greater than 100 Å/min.

As such, by using the etchant composition according to an example embodiment, even when a Ge content in an SiGe film is relatively low, a high etch selectivity of the SiGe film with respect to an Si film may be obtained.

FIG. 1 is a flowchart illustrating a method of manufacturing an integrated circuit device, according to an example embodiment.

In a process P10 of FIG. 1, a structure, in which a plurality of Si films and a plurality of SiGe films are alternately stacked, may be formed on a substrate.

The substrate may include a semiconductor substrate. In an example embodiment, the semiconductor substrate may include an elemental semiconductor, such as Si or Ge, or a compound semiconductor, such as silicon carbide (SiC), gallium arsenide (GaAs), indium arsenide (InAs), or indium phosphide (InP).

To form the structure, an epitaxial growth process may be performed. In the structure, each of the plurality of Si films may include a single-crystal Si film. Each of the plurality of SiGe films may have a Ge content selected from a range of about 10 at % to about 20 at %. In example embodiments, in each of the plurality of SiGe films, the Ge content may be selected from a range of about 12 at % to about 18 at % or a range of about 14 at % to about 16 at %. For example, in each of the plurality of SiGe films, the Ge content may be about 15 at %.

In a process P20 of FIG. 1, the plurality of SiGe films (from among the plurality of Si films and the plurality of SiGe films) may be selectively removed by using an etchant composition according to an example embodiment. A detailed configuration of the etchant composition is as described above.

In an example embodiment, in the etchant composition, the oxidant may include peracetic acid, performic acid, acetic acid, formic acid, propionic acid, or a combination thereof, the fluorine compound may include hydrofluoric acid (HF), the amine compound may include a C1-C8 aliphatic polyamine, the alcohol compound may include a C8-C16 alkane-1,2-diol, and the organic solvent may include acetic acid. The etchant composition may further include about 0.01% by weight (wt %) to about 5 wt % of a catalyst, based on a total weight of the etchant composition. The catalyst may include sulfuric acid or methanesulfonic acid.

FIGS. 2A to 8C are diagrams illustrating a method of manufacturing an integrated circuit device 100 (see FIGS. 8A, 8B, and 8C) according to an example embodiment.

More specifically, each of FIGS. 2A, 3A, 4A, 6A, 7A, and 8A is a plan view illustrating the method of manufacturing the integrated circuit device 100. FIG. 2B, FIG. 3B, FIGS. 4B and 5, FIG. 6B, and FIG. 8B are enlarged cross-sectional views of cross-sectional areas taken along lines A-A' of FIG. 2A, FIG. 3A, FIG. 4A, FIG. 6A, and FIG. 8A, respectively. FIGS. 7B and 8C are enlarged cross-sectional views taken along lines B-B' of FIGS. 7A and 8A, respectively.

Figure 2A:
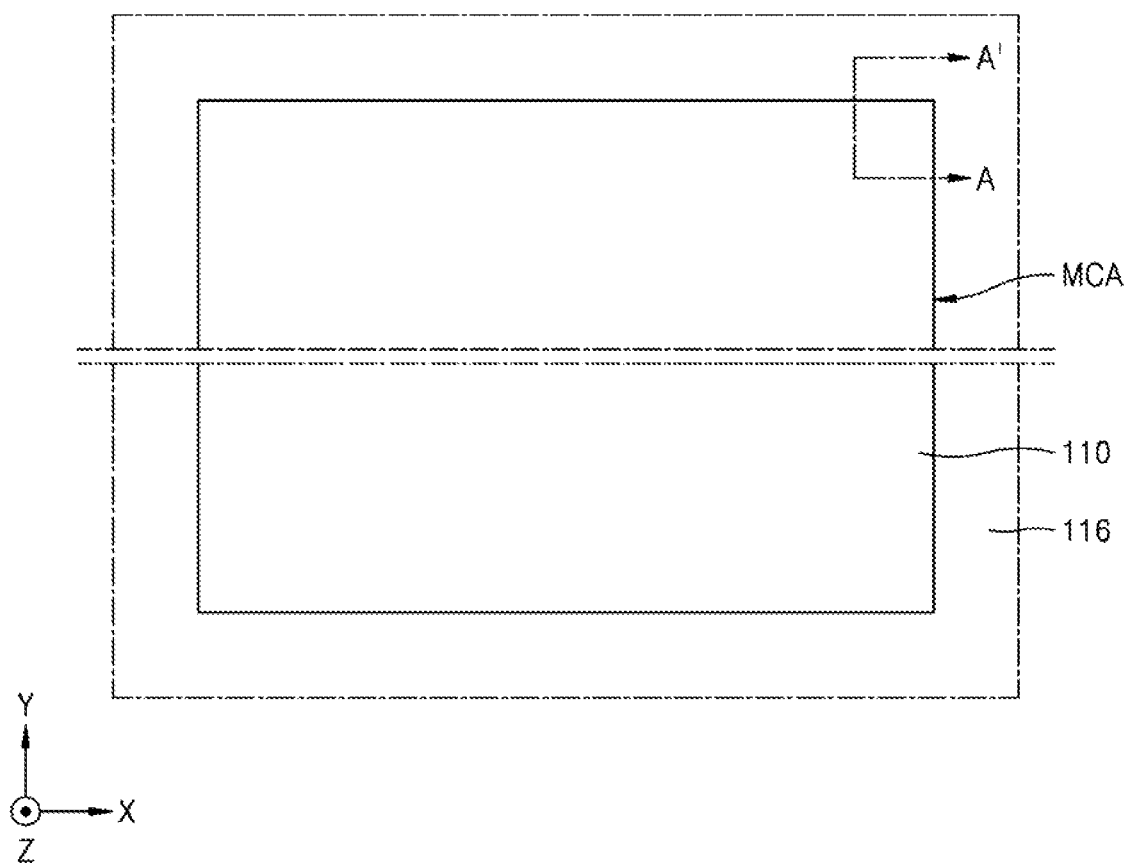
Figure 2B:
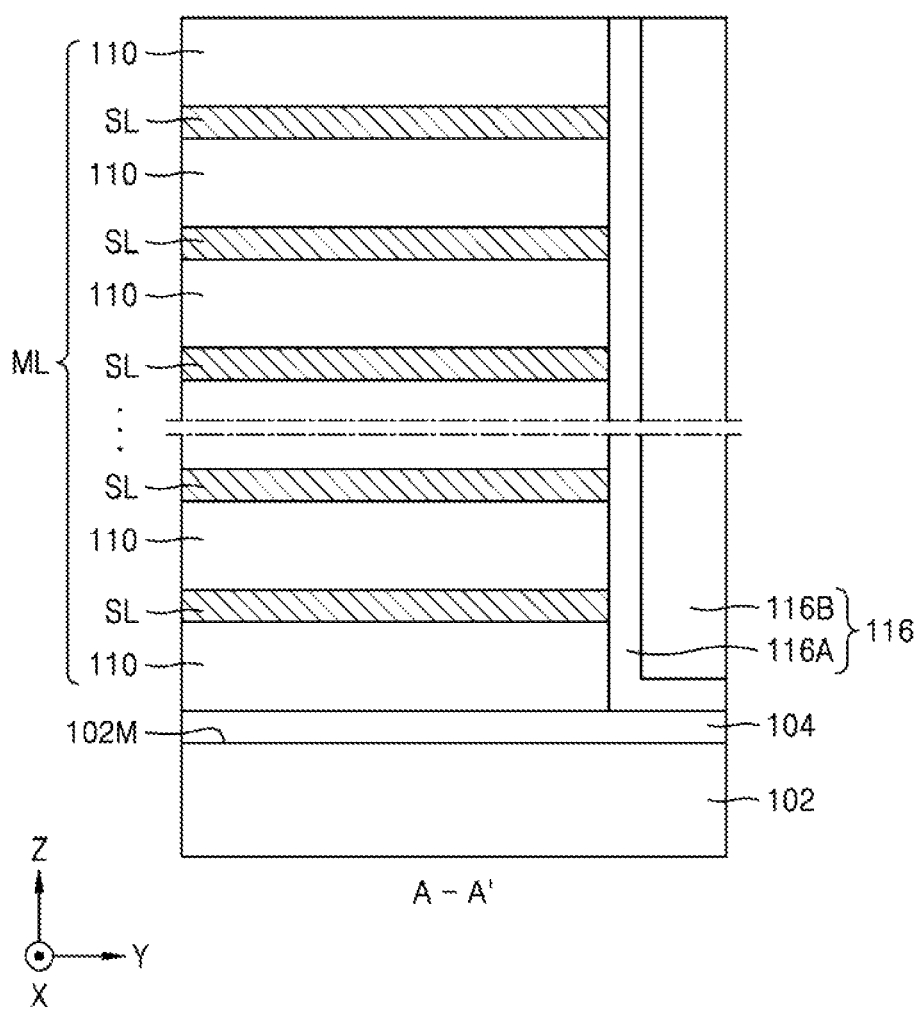

Referring to FIGS. 2A and 2B, a lower insulating film 104 may be formed on a main surface 102M of a substrate 102. A mold layer ML, including a plurality of semiconductor films 110 and a plurality of sacrificial films SL, may be formed on the lower insulating film 104. Among the plurality of semiconductor films 110, the upper surface of the semiconductor film 110 that is uppermost and farthest from the substrate 102 may correspond to the uppermost surface of the mold layer ML.

The substrate 102 may include an elemental semiconductor, such as Si or Ge, or a compound semiconductor, such as SiGe, SiC, GaAs, InAs, InGaAs, or InP.

The lower insulating film 104 may include a silicon oxide film, a silicon nitride film, a silicon oxynitride film, or a combination thereof.

The mold layer ML may have a structure in which the plurality of semiconductor films 110 and the plurality of sacrificial films SL are alternately stacked. Each of the plurality of semiconductor films 110 and the plurality of sacrificial films SL, which constitute the mold layer ML, may be formed by an epitaxial growth process. In an example embodiment, each of the plurality of semiconductor films 110 may include a single-crystal Si film, and each of the plurality of sacrificial films SL may include an SiGe film.

Each of the plurality of semiconductor films 110 may include a single-crystal Si film, whereby leakage current may be easily controlled in a plurality of channel regions CH (see FIG. 8C) respectively formed from the plurality of semiconductor films 110.

In forming each of the plurality of semiconductor films 110 and the plurality of sacrificial films SL, which constitute the mold layer ML, by an epitaxial growth process, to prevent dislocation due to lattice mismatch in the plurality of semiconductor films 110 each including a single-crystal Si film, each of the plurality of sacrificial films SL may have a relatively low Ge content. To this end, the SiGe film constituting the plurality of sacrificial films SL may have a Ge content selected from a range of about 10 at % to about 20 at %. In an example embodiment, the SiGe film constituting the plurality of sacrificial films SL may have a Ge content selected from a range of about 12 at % to about 18 at % or a range of about 14 at % to about 16 at %. For example, the SiGe film constituting the plurality of sacrificial films SL may have a Ge content of about 15 at %.

The mold layer ML may be partially removed, such that the mold layer ML remains only in a memory cell array area MCA.

Next, an insulating structure 116 may be formed around the memory cell array area MCA to cover the sidewall of the mold layer ML.

The insulating structure 116 may include a silicon nitride film 116A and a silicon oxide film 116B. The silicon nitride film 116A may contact the sidewall of each of the plurality of semiconductor films 110 and the plurality of sacrificial films SL, which constitute the mold layer ML, and the upper surface of the lower insulating film 104. The silicon oxide film 116B may be arranged on the silicon nitride film 116A to cover the mold layer ML and the substrate 102.

In other implementations, a configuration of the insulating structure 116 including various constituent materials and having various stack structures may be formed.

Figure 3A:
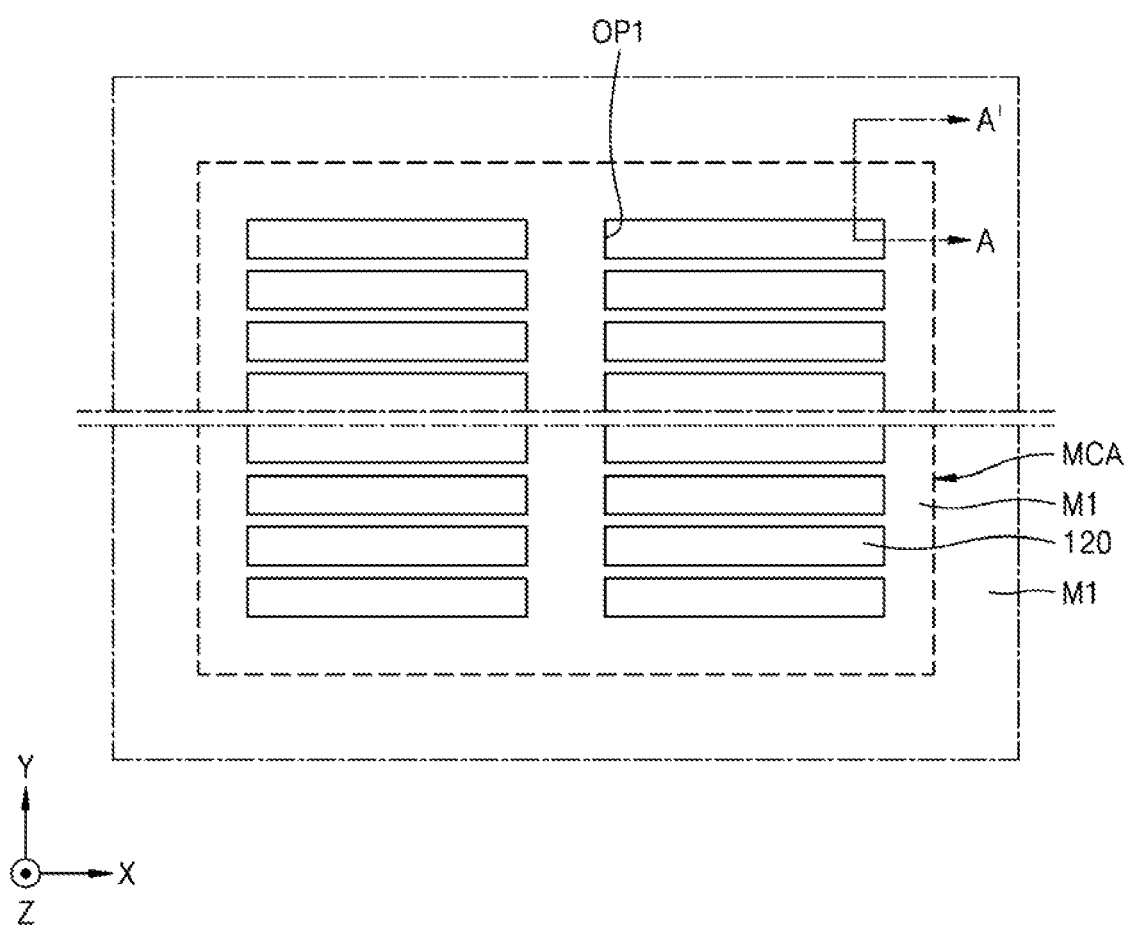
Figure 3B:
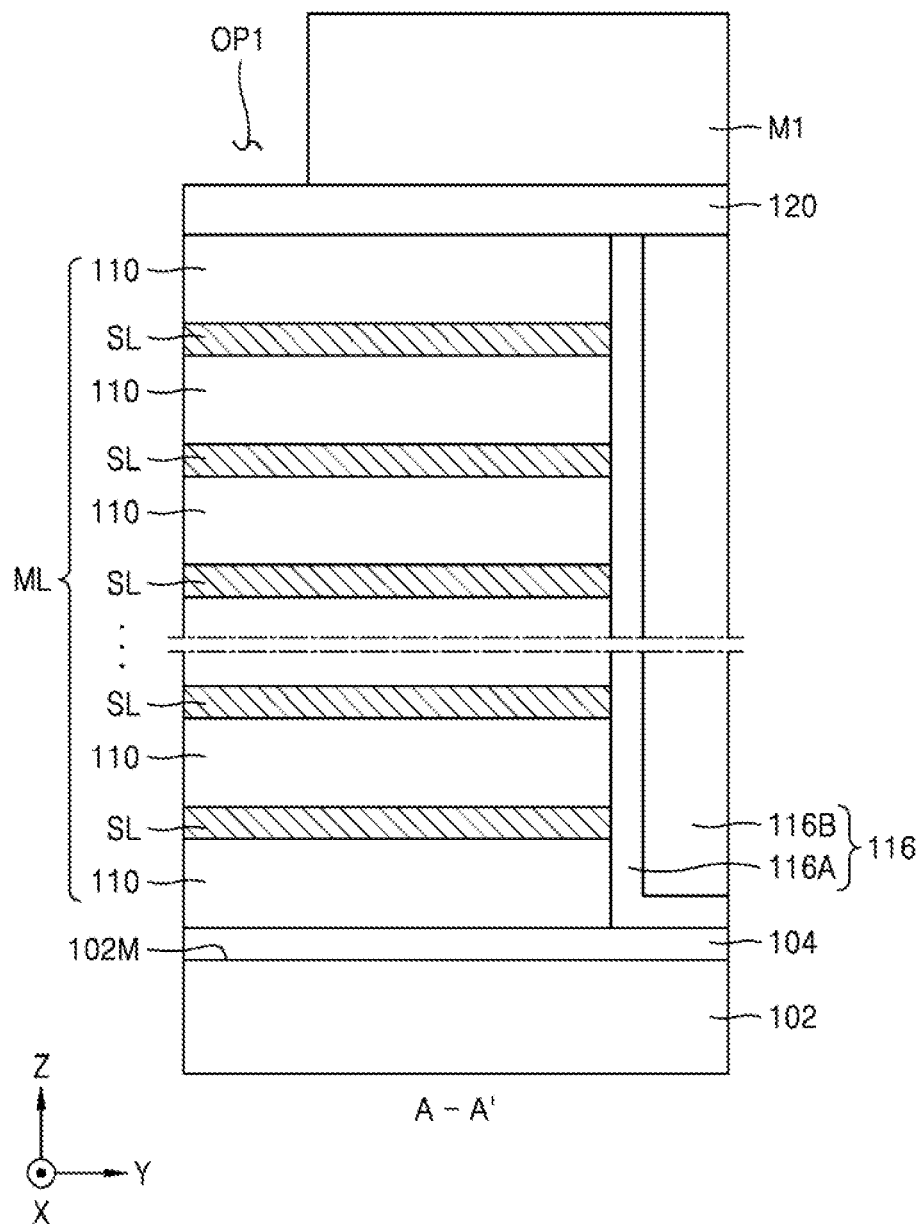

Referring to FIGS. 3A and 3B, an upper insulating film 120 may be formed on the mold layer ML.

In an example embodiment, the upper insulating film 120 may include a silicon oxide film, a silicon nitride film, a silicon oxynitride film, or a combination thereof.

A mask pattern M1 having a plurality of openings OP1 may be formed on the upper insulating film 120. The upper insulating film 120 may be exposed by the plurality of openings OP1 of the mask pattern M1.

The mask pattern M1 may include a silicon nitride film. To form the mask pattern M1, a photolithography process may be used.

Figure 4A:
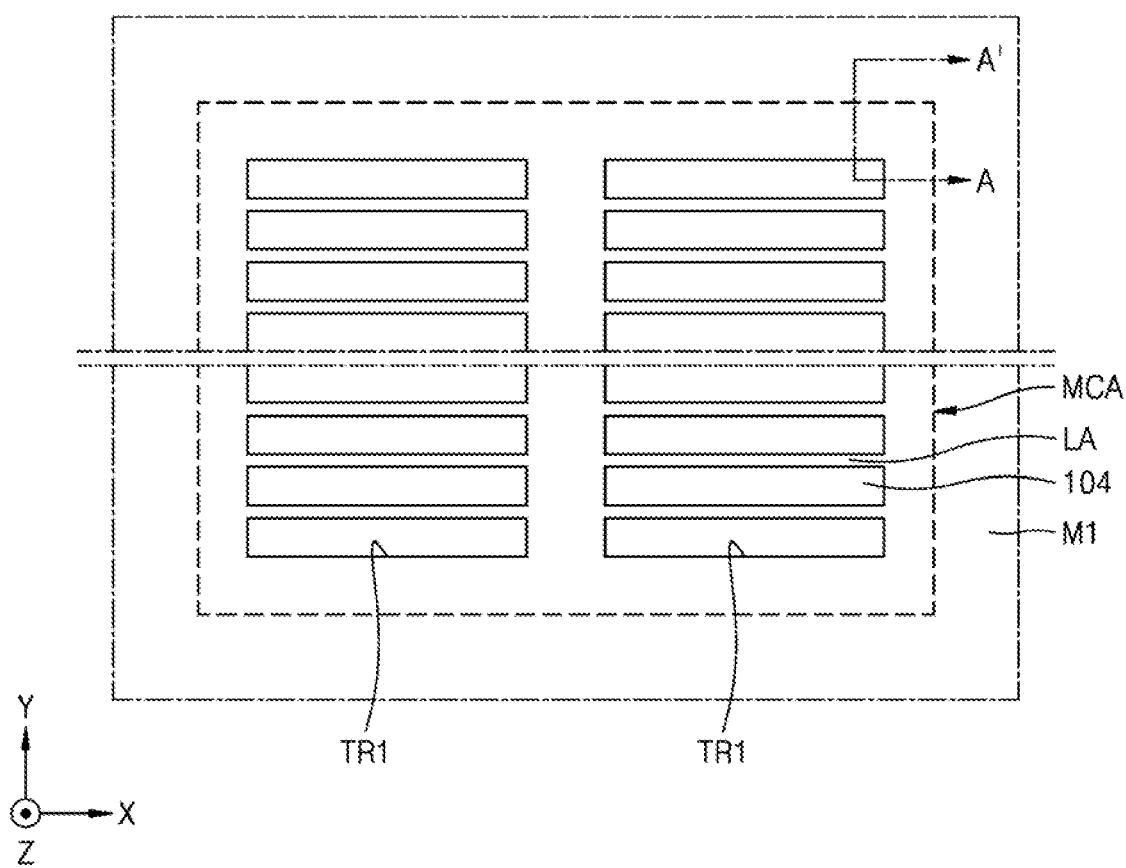
Figure 4B:
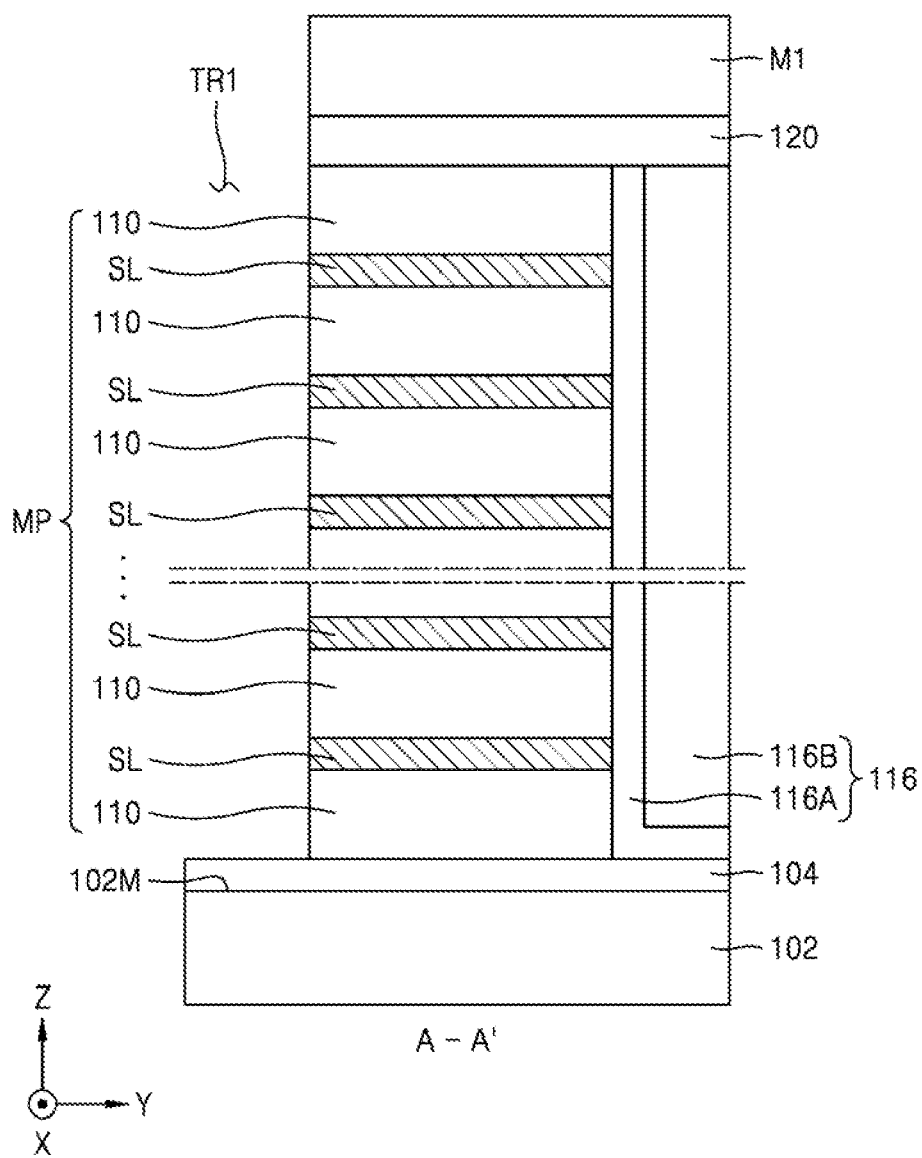

Referring to FIGS. 4A and 4B, in a resulting product of FIGS. 3A and 3B, the upper insulating film 120 and the mold layer ML may be anisotropically etched through the plurality of openings OP1 by using the mask pattern M1 as an etch mask, thereby forming a mold pattern MP including a plurality of first trenches TR1, which extend lengthwise in a first horizontal direction (X direction) through the upper insulating film 120 and the mold layer ML, and a plurality of line areas LA, which extend lengthwise in the first horizontal direction (X direction).

Thus, the mold pattern MP may include respective remaining portions of the plurality of semiconductor films 110 and the plurality of sacrificial films SL.

After the mold pattern MP is formed, the lower insulating film 104 may be exposed by the plurality of first trenches TR1. The plurality of first trenches TR1 do not pass through the lower insulating film 104, and thus, the substrate 102 may not be exposed by the plurality of first trenches TR1. While an etching process for forming the mold pattern MP is performed, a height of the mask pattern M1 used as an etch mask may be reduced.

The plurality of first trenches TR1 may each have a line shape extending lengthwise in the first horizontal direction (X direction). The plurality of first trenches TR1 may be arranged apart from each other in the first horizontal direction (X direction) and a second horizontal direction (Y direction). Respective widths of the plurality of channel regions CH (see FIG. 8C) in the second horizontal direction (Y direction) may be determined by the plurality of first trenches TR1, the plurality of channel regions CH being respectively formed from the plurality of semiconductor films 110.

Figure 5:
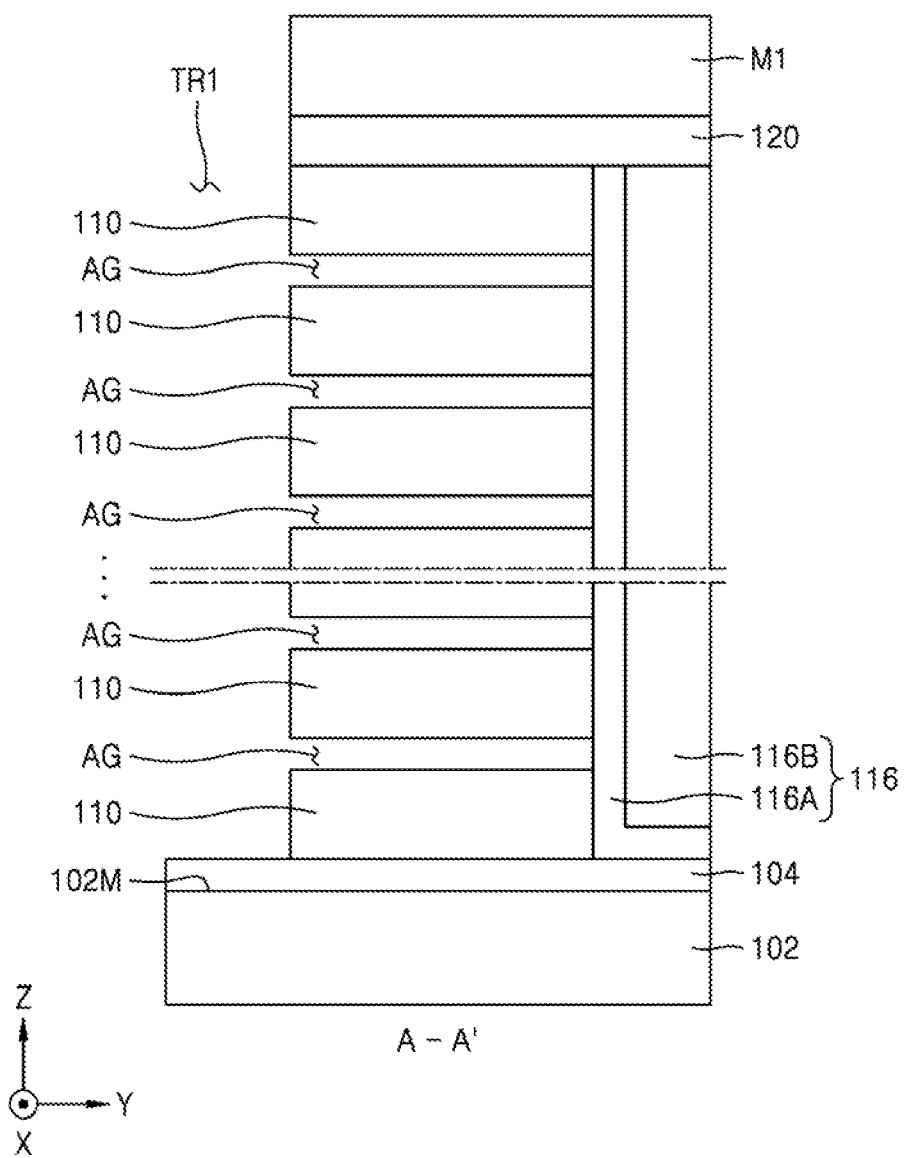

Referring to FIG. 5, the plurality of sacrificial films SL may be removed from a resulting product of FIGS. 4A and 4B through the plurality of first trenches TR1, thereby forming a plurality of air gaps AG, which expose portions of respective surfaces of the plurality of semiconductor films 110 and the silicon nitride film 116A. The plurality of air gaps AG may be connected to a first trench TR1.

To remove the plurality of sacrificial films SL, an etchant composition according to an example embodiment may be applied to the mold pattern MP through the plurality of first trenches TR1. A detailed configuration of the etchant composition according to an example embodiment is described above. By applying the etchant composition to the mold pattern MP, the plurality of sacrificial films SL from among the plurality of semiconductor films 110 and the plurality of sacrificial films SL may be selectively removed.

In an example embodiment, in the etchant composition used to selectively remove the plurality of sacrificial films SL, the oxidant may include peracetic acid, performic acid, acetic acid, formic acid, propionic acid, or a combination thereof, the fluorine compound may include hydrofluoric acid (HF), the amine compound may include a C1-C8 aliphatic polyamine, the alcohol compound may include a C8-C16 alkane-1,2-diol, and the organic solvent may include acetic acid. The etchant composition may further include about 0.01 wt % to about 5 wt % of a catalyst, based on a total weight of the etchant composition. The catalyst may include sulfuric acid or methanesulfonic acid.

In a structure in which the Si film, the SiGe film, and the silicon nitride film are simultaneously exposed and the Ge content in each of the plurality of SiGe films is about 15 at %, in selectively removing the plurality of SiGe films by using the etchant composition according to an example embodiment, the etch selectivity of the SiGe film with respect to the Si film may be 100 or more, and the etch selectivity of the SiGe film with respect to the silicon nitride film may be 50 or more. As such, by using the etchant composition according to an example embodiment, even when the Ge content in the SiGe film is relatively low, a high etch selectivity of the SiGe film with respect to each of the Si film and the silicon nitride film may be obtained.

Figure 6A:
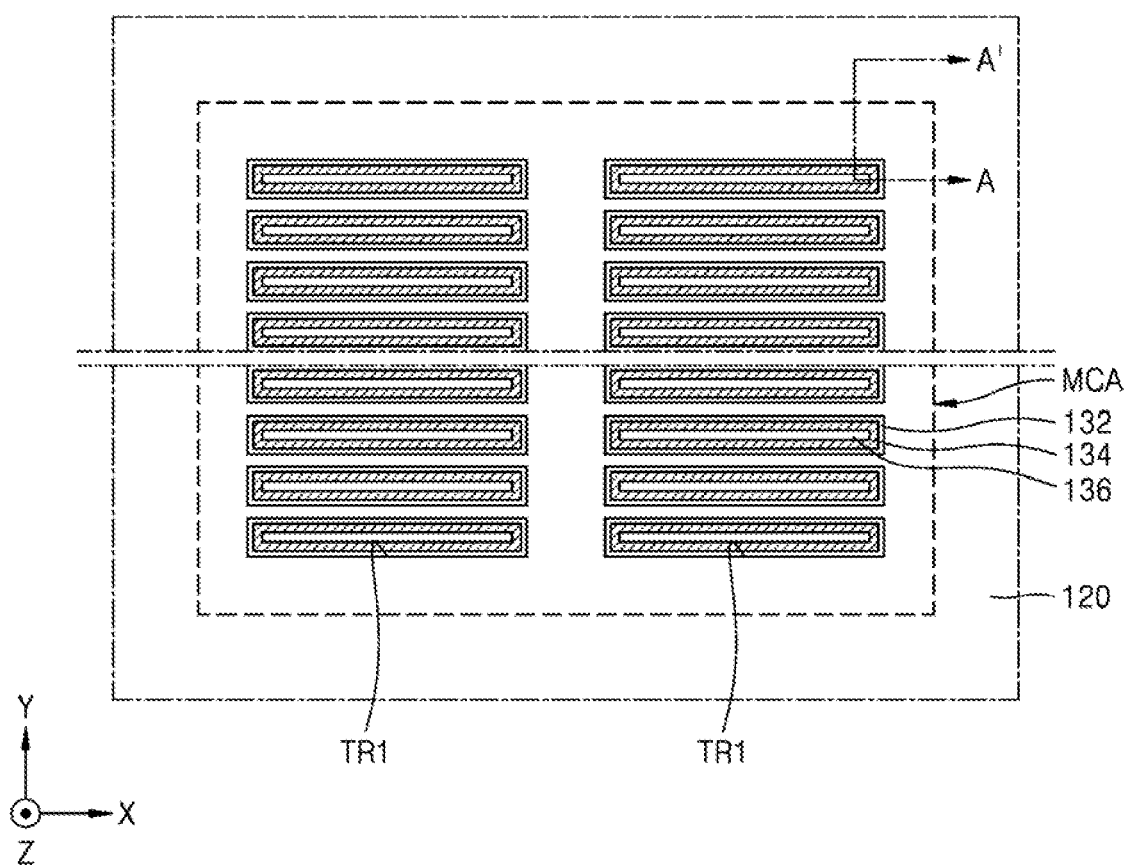
Figure 6B:
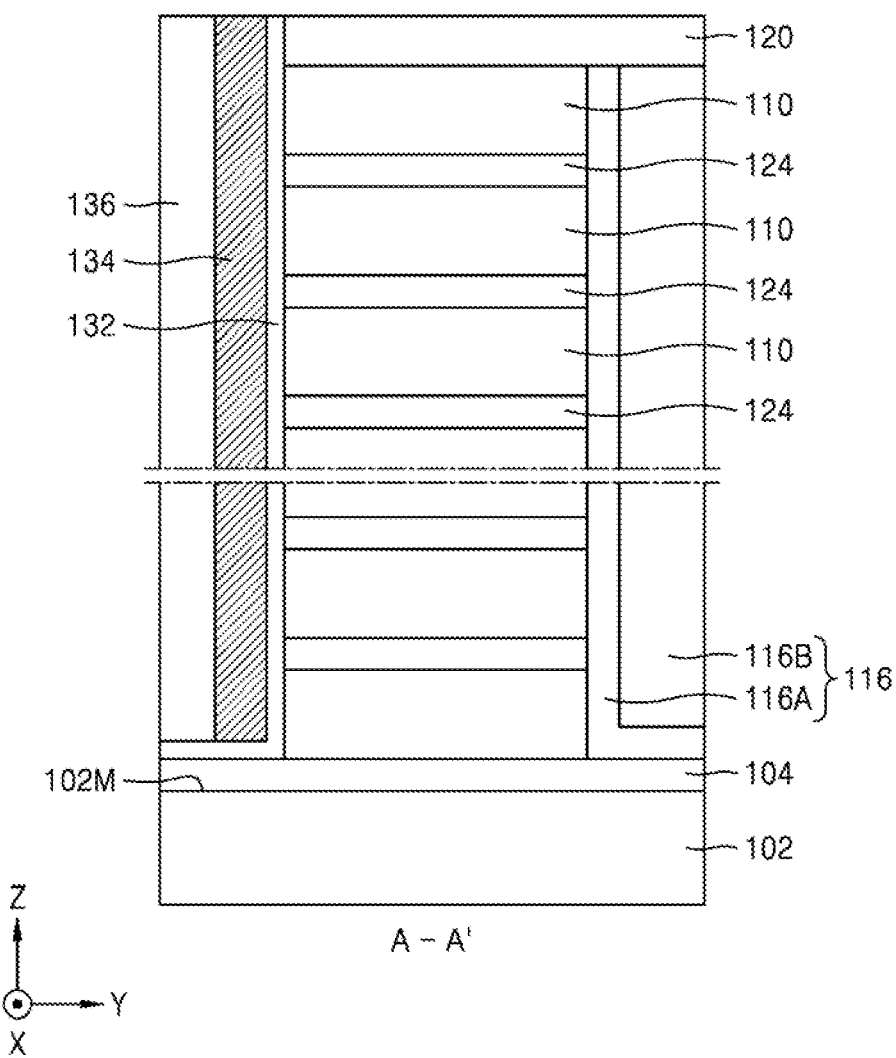

Referring to FIGS. 6A and 6B, a process of removing the mask pattern M1 from a resulting product of FIG. 5 and a process of filling the plurality of air gaps AG respectively with a plurality of intermediate insulating films 124 may be performed.

The plurality of intermediate insulating films 124 may each include a silicon oxide film, a silicon nitride film, a silicon oxynitride film, a carbon-containing silicon oxide film, a carbon-containing silicon nitride film, a carbon-containing silicon oxynitride film, or a combination thereof. In an example embodiment, to form the plurality of intermediate insulating films 124, an insulating film may be formed to fill the air gap AG between the plurality of semiconductor films 110 by an atomic layer deposition (ALD) process, followed by removing unnecessary portions of the insulating film, thereby leaving the plurality of intermediate insulating films 124 between the plurality of semiconductor films 110 arranged in a vertical direction (Z direction).

Next, a gate insulating film 132 may be formed to conformally cover the sidewall of each of the plurality of semiconductor films 110 and the sidewall of each of the plurality of intermediate insulating films 124, which are exposed by the plurality of first trenches TR1, followed by forming a gate line 134 on the gate insulating film 132 to conformally cover the gate insulating film 132 in the plurality of first trenches TR1, and then, respective portions of the gate insulating film 132 and the gate line 134 may be removed such that the upper surface of the upper insulating film 120 is exposed and the gate insulating film 132 is exposed at the bottom surface of each of the plurality of first trenches TR1. In an example embodiment, to form the gate insulating film 132 and a plurality of gate lines 134, an ALD process may be used.

Next, a buried insulating film 136 may be formed on the gate line 134 to fill the plurality of first trenches TR1. The upper surface of the buried insulating film 136 may be planarized to extend on the same plane as the upper surface of the upper insulating film 120.

The gate insulating film 132 may include a stack structure of an interfacial layer and a high-k film. The interfacial layer may include a low-k material film having a permittivity of about 9 or less, e.g., a silicon oxide film, a silicon oxynitride film, or a combination thereof. In an example embodiment, the interfacial layer may be omitted. The high-k film may include a material having a greater dielectric constant than a silicon oxide film. For example, the high-k film may have a dielectric constant of about 10 to about 25. The high-k film may include hafnium oxide, hafnium silicon oxide, zirconium oxide, zirconium silicon oxide, or a combination thereof.

The gate line 134 may include a doped semiconductor, a metal, a conductive metal nitride, a conductive metal carbide, or a combination thereof. The metal may be selected from Ti, W, Ru, Nb, Mo, Hf, Ni, Co, Pt, Yb, Tb, Dy, Er, and Pd. The conductive metal nitride may be selected from TiN and TaN. The conductive metal carbide may include TiAlC. In an example embodiment, the gate line 134 may include a stack structure of a conductive barrier film and a metal film. For example, the conductive barrier film may include TiN or TaN, and the metal film may include W.

The buried insulating film 136 may include a silicon oxide film, a silicon nitride film, a silicon oxynitride film, or a combination thereof.

Figure 7A:
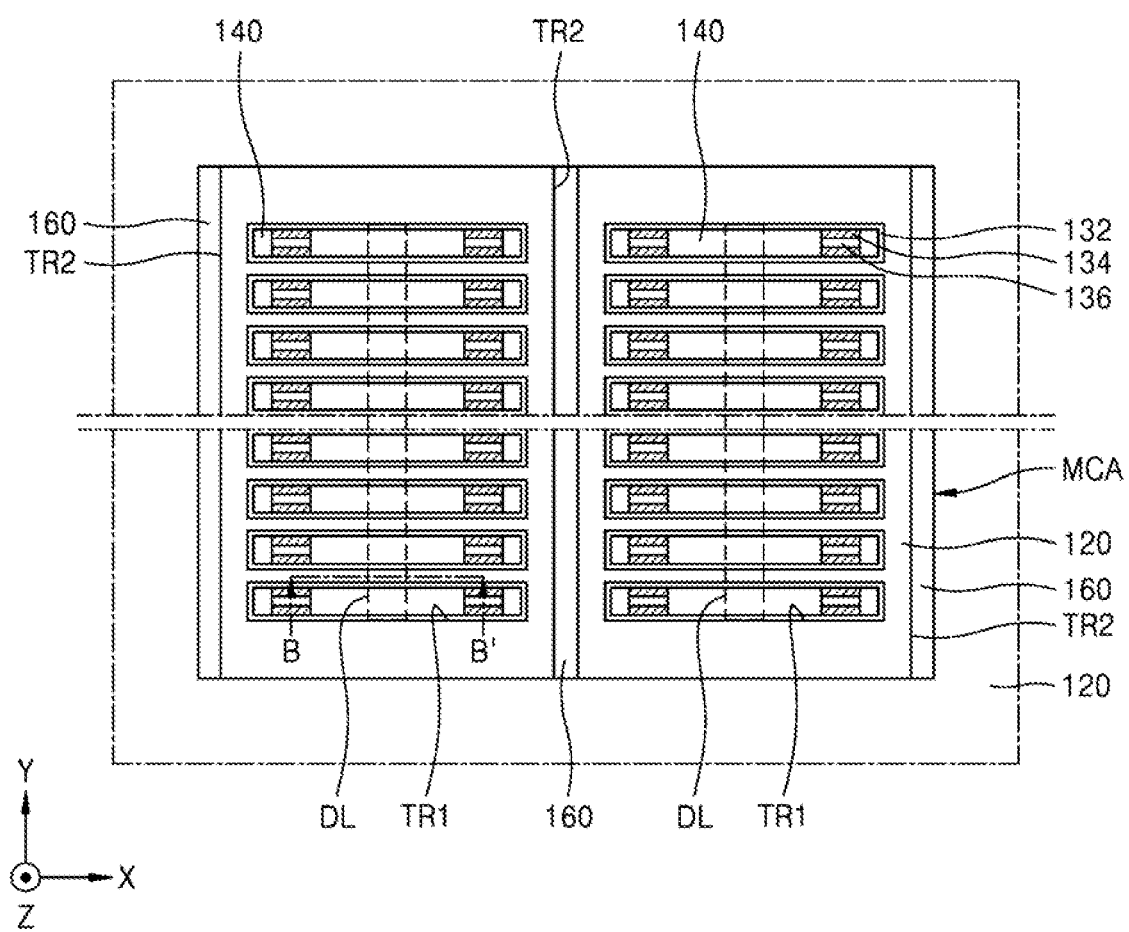
Figure 7B:
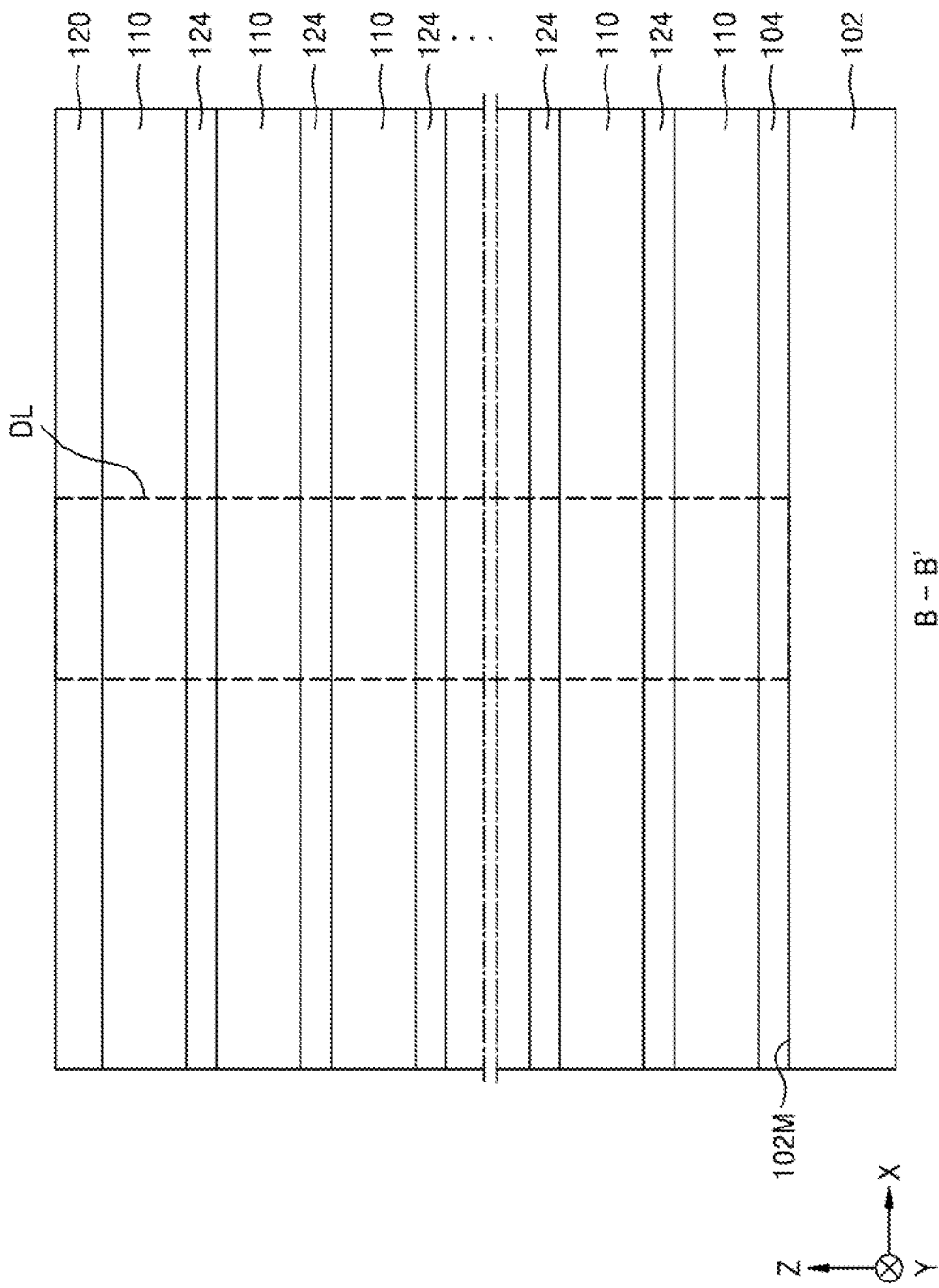

Referring to FIGS. 7A and 7B, a mask pattern (not shown) may be formed on a resulting product of FIGS. 6A and 6B, followed by removing unnecessary portions of the gate line 134 and the buried insulating film 136 by using the mask pattern as an etch mask, thereby leaving the gate line 134 and the buried insulating film 136, which cover both sidewalls of each of the plurality of semiconductor films 110 in the second horizontal direction (Y direction) in respective portions of the plurality of semiconductor films 110. A portion of the semiconductor film 110, which is covered with the gate line 134, may include the channel region CH (see FIG. 8C).

Next, a plurality of vertical insulating patterns 140 may be formed to respectively fill remaining spaces inside the plurality of first trenches TR1. Each of the plurality of vertical insulating patterns 140 may cover both sidewalls of each of the gate line 134 and the buried insulating film 136 in each of the plurality of first trenches TR1. Each of the plurality of vertical insulating patterns 140 may include portions surrounded by the gate insulating film 132 in each of the plurality of first trenches TR1. The plurality of vertical insulating patterns 140 may each include a silicon oxide film, a silicon nitride film, a silicon oxynitride film, or a combination thereof.

Next, referring to FIG. 7A, a plurality of second trenches TR2 (which are arranged apart from the plurality of first trenches TR1 on both sides of each of the plurality of first trenches TR1 in the first horizontal direction (X direction) and extend lengthwise in the second horizontal direction (Y direction)) may be formed, followed by providing a plurality of spaces to expose respective portions of the plurality of semiconductor films 110 by removing respective portions of the plurality of intermediate insulating films 124, which are exposed by the plurality of second trenches TR2. Then, the plurality of semiconductor films 110 may be doped with impurities through the plurality of spaces, thereby forming a first source/drain region (not shown) in each of the plurality of semiconductor films 110. Next, a portion of each of the plurality of spaces may be filled with a conductive material, e.g., a metal, thereby forming a bit line (not shown) in contact with the first source/drain region. Each of the plurality of bit lines may be formed to be connectable only to the plurality of semiconductor films 110 located at one horizontal level over the substrate 102. After the plurality of bit lines are formed, the plurality of second trenches TR2 may be filled with a bit line filling insulating film 160.

Each of the bit line and the bit line filling insulating film 160 may extend lengthwise in the second horizontal direction (Y direction). In an example embodiment, the bit line may include doped polysilicon, a metal, a conductive metal nitride, a metal silicide, or a combination thereof. The metal silicide may include tungsten silicide, cobalt silicide, or titanium silicide. The bit line filling insulating film 160 may include a silicon oxide film, a silicon nitride film, a silicon oxynitride film, or a combination thereof.

Figure 8A:
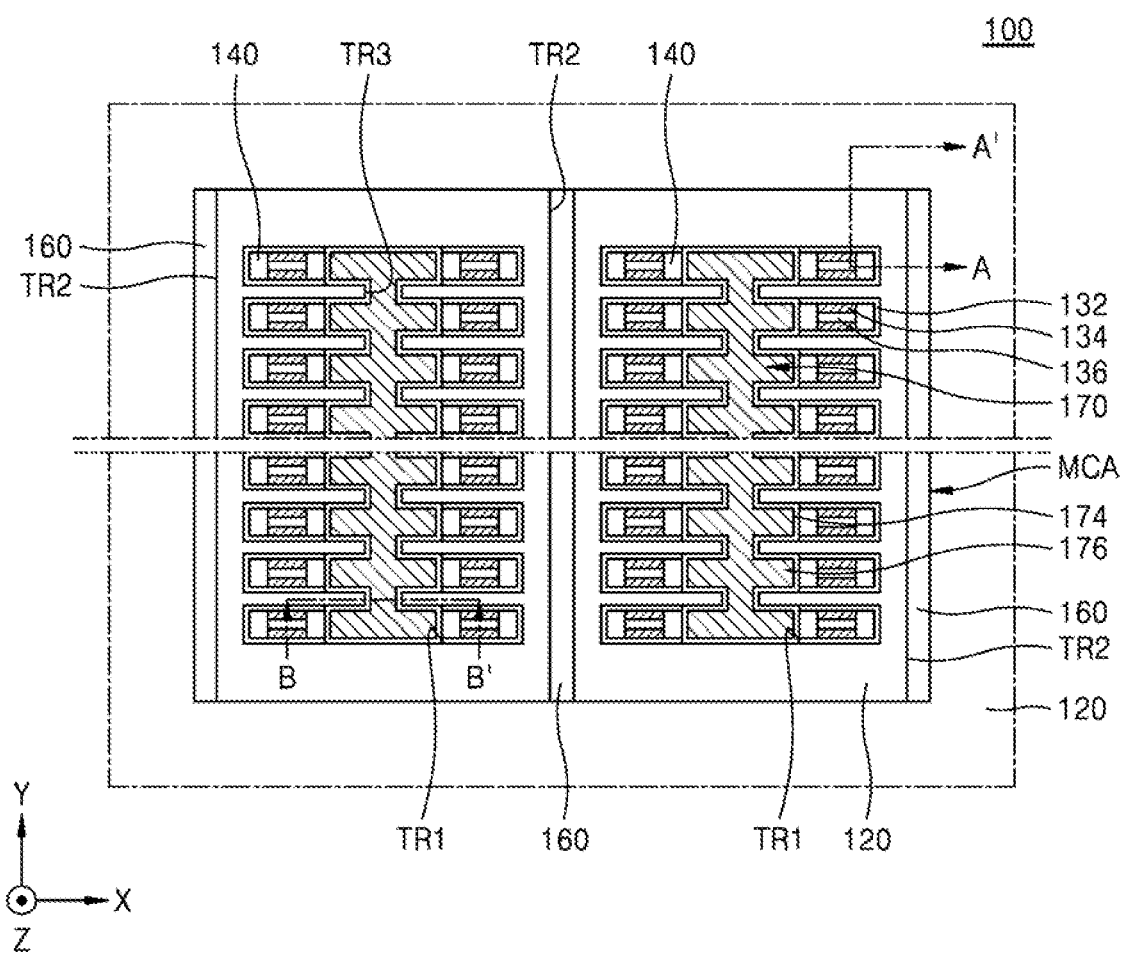
Figure 8B:
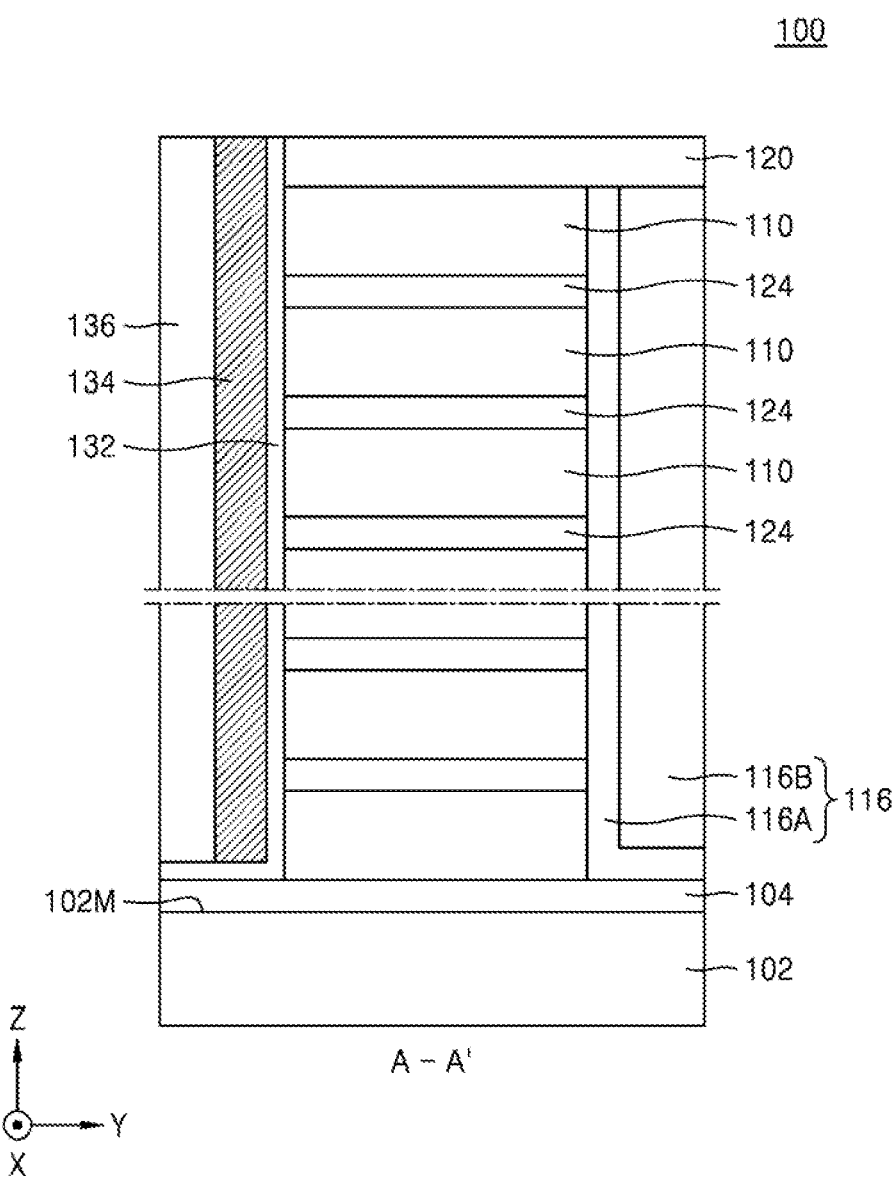

Referring to FIGS. 8A, 8B, and 8C, in a resulting product of FIGS. 7A and 7B, portions of the plurality of semiconductor films 110 may be respectively substituted with a plurality of capacitors 170. To this end, a plurality of third trenches TR3, which expose the substrate 102, may be formed by removing a portion of each of the upper insulating film 120, the plurality of semiconductor films 110, the plurality of intermediate insulating films 124, and the lower insulating film 104 from an area DL marked by a dashed line in FIGS. 7A and 7B, and respective widths of the plurality of semiconductor films 110 in the first horizontal direction (X direction) may be reduced by removing respective portions of the plurality of semiconductor films 110, which are exposed at inner sidewalls of the plurality of third trenches TR3. As a result, a plurality of indent regions IND may be formed between the lower insulating film 104 and the intermediate insulating film 124 at a lowermost level, between the plurality of intermediate insulating films 124, and between the intermediate insulating film 124 at an uppermost level and the upper insulating film 120, the plurality of indent regions IND respectively exposing portions of the plurality of semiconductor films 110, which have reduced widths.

In addition, referring to FIG. 8A, in portions of the plurality of third trenches TR3, which overlap the plurality of first trenches TR1, respective widths of the plurality of third trenches TR3 in the first horizontal direction (X direction) may be increased by removing portions of the plurality of vertical insulating patterns 140 and portions of the plurality of gate insulating films 132, which are exposed by the plurality of third trenches TR3.

A second source/drain region SD2 (see FIG. 8C) may be formed by doping a portion of each of the plurality of semiconductor films 110, which are exposed by the plurality of indent regions IND, with impurities. A portion of each of the plurality of semiconductor films 110, excluding the first source/drain region (not shown) and the second source/drain region SD2, may correspond to the channel region CH.

The plurality of capacitors 170 may be respectively formed in the plurality of indent regions IND. In an example embodiment, referring to FIG. 8C, to form the plurality of capacitors 170, a plurality of first electrode layers 172 may be formed first to conformally cover respective exposed surfaces of the intermediate insulating film 124 and the plurality of semiconductor films 110, which are exposed inside the plurality of indent regions IND. Each of the plurality of first electrode layers 172 may contact the second source/drain region SD2 formed in each of the plurality of semiconductor films 110. Next, a dielectric film 174 may be formed to conformally cover surfaces exposed by the plurality of third trenches TR3. The dielectric film 174 may conformally cover respective surfaces of the plurality of first electrode layers 172, a surface of each intermediate insulating film 124, respective surfaces of the plurality of upper insulating films 120, and a surface of the substrate 102, which are exposed by the plurality of third trenches TR3, the surface of the substrate 102 being exposed at the bottom surface of each of the plurality of third trenches TR3. Next, a second electrode layer 176 may be formed to fill respective remaining spaces of the plurality of indent regions IND and the plurality of third trenches TR3.

In the plurality of capacitors 170, the plurality of first electrode layers 172 and the second electrode layer 176 may each include a metal film, a conductive metal oxide film, a conductive metal nitride film, a conductive metal oxynitride film, or a combination thereof. In an example embodiment, the plurality of first electrode layers 172 and the second electrode layer 176 may each include Ti, Ti oxide, Ti nitride, Ti oxynitride, Co, Co oxide, Co nitride, Co oxynitride, Nb, Nb oxide, Nb nitride, Nb oxynitride, Sn, Sn oxide, Sn nitride, Sn oxynitride, or a combination thereof. For example, the plurality of first electrode layers 172 and the second electrode layer 176 may each include TiN, CoN, NbN, $SnO_2$, or a combination thereof. The dielectric film 174 may include a high-k film. For example, the dielectric film 174 may include $HfO_2$, $ZrO_2$, $Al_2O_3$, $La_2O_3$, $Ta_2O_3$, $Nb_2O_5$, $CeO_2$, $TiO_2$, $GeO_2$, or a combination thereof.

According to the method of manufacturing the integrated circuit device 100, described with reference to FIGS. 2A to 8C, by using a single-crystal Si film as the channel region CH of the integrated circuit device 100, control of leakage current in the channel region CH may be enhanced. In addition, in selectively removing the plurality of sacrificial films SL from the mold pattern MP including the plurality of semiconductor films 110, which include Si films, and the plurality of sacrificial films SL, which include SiGe films, the etchant composition according to an example embodiment is used. Therefore, even when each of the plurality of sacrificial films SL has a relatively low Ge content of about 10 at % to about 20 at %, e.g., a Ge content of about 15 at % (to prevent dislocation due to lattice mismatch in the plurality of semiconductor films 110 including single-crystal Si films), the plurality of sacrificial films SL may be removed at high etch selectivity with respect to the plurality of semiconductor films 110 including single-crystal Si films. Therefore, the reliability of the integrated circuit device 100 may improve.

By way of summation and review, a technique for securing the reliability of a 3-dimensional semiconductor memory device, in which a silicon (Si) film is used as a channel region, is desired.

As described above, an example embodiment may provide an etchant composition that may provide a high etch selectivity of a silicon germanium (SiGe) film with respect to a silicon (Si) film.

An example embodiment may provide a method of manufacturing an integrated circuit device, the method allowing the reliability of an integrated circuit device to be improved by removing an SiGe film with high etch selectivity to an Si film during the process of manufacturing a 3-dimensional semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A method of manufacturing an integrated circuit device, the method comprising:
   forming, on a substrate, a structure in which a plurality of silicon films and a plurality of silicon germanium films are alternately stacked; and
   selectively removing the plurality of silicon germanium films from among the plurality of silicon films by using an etchant composition,
   wherein the etchant composition includes:
   about 5 wt % to about 14 wt % of an oxidant, based on a total weight of the etchant composition;
   about 0.01 wt % to about 5 wt % of a fluorine compound, based on the total weight of the etchant composition;
   about 0.01 wt % to about 5 wt % of an amine compound, based on the total weight of the etchant composition;
   about 0.01 wt % to about 1 wt % of an alcohol compound having a hydrophilic head and a hydrophobic tail, based on the total weight of the etchant composition;
   about 60 wt % to about 90 wt % of an organic solvent, based on the total weight of the etchant composition; and
   a balance of water.

2. The method as claimed in claim 1, wherein:
   in the forming of the structure, each of the plurality of silicon films and the plurality of silicon germanium films is formed by an epitaxial growth process,
   each of the plurality of silicon films includes a single-crystal silicon film, and
   a germanium content in each of the plurality of silicon germanium films is in a range of about 10 at % to about 20 at %.

3. The method as claimed in claim 1, further comprising, after the forming of the structure, forming a silicon nitride film to cover a sidewall of the structure, wherein:
   the plurality of silicon germanium films are selectively removed from among the silicon nitride film and the plurality of silicon films by using the etchant composition, and
   after selectively removing the plurality of silicon germanium films, the silicon nitride film and the plurality of silicon films are exposed in spaces from which the plurality of silicon germanium films are removed.

4. The method as claimed in claim 1, wherein, in the etchant composition, the oxidant includes a C1-C6 carboxylic acid compound, a C1-C6 peroxyacid compound, or a combination thereof.

5. The method as claimed in claim 1, wherein, in the etchant composition, the fluorine compound includes hydrofluoric acid (HF), sodium fluoride (NaF), potassium fluoride (KF), aluminum fluoride ($AlF_3$), lithium fluoride (LiF), calcium fluoride ($CaF_2$), ammonium fluoride ($NH_4F$), ammonium difluoride ($NH_4HF_2$), tetramethylammonium fluoride (($CH_3$)$_4$NF), potassium bifluoride ($KHF_2$), fluoroboric acid ($HBF_4$), ammonium tetrafluoroborate ($NH_4BF_4$), potassium fluoroborate ($KBF_4$), hexafluorosilicic acid ($H_2SiF_6$), or a combination thereof.

6. The method as claimed in claim 1, wherein, in the etchant composition, the amine compound is selected from a C1-C8 aliphatic amine compound and a 5- to 8-membered cyclic amine.

7. The method as claimed in claim 1, wherein, in the etchant composition, the alcohol compound includes a polyhydric alcohol having a C8-C16 normal alkyl group and at least two hydroxyl groups.

8. The method as claimed in claim 1, wherein, in the etchant composition, the organic solvent includes a C1-C5 carboxylic acid compound.

9. A method of manufacturing an integrated circuit device, the method comprising:
forming, on a substrate, a mold layer in which a plurality of silicon films and a plurality of silicon germanium films are alternately stacked;
forming an insulating structure to cover a sidewall of the mold layer;
forming a mold pattern by forming a trench through anisotropic etching of the plurality of silicon films and the plurality of silicon germanium films, the mold pattern including respective remaining portions of the plurality of silicon films and the plurality of silicon germanium films, which define the trench; and
forming a plurality of air gaps by selectively removing, from the mold pattern, the plurality of silicon germanium films through the trench by using an etchant composition, the plurality of air gaps exposing the plurality of silicon films and the insulating structure,
wherein the etchant composition includes:
about 5 wt % to about 14 wt % of an oxidant, based on a total weight of the etchant composition;
about 0.01 wt % to about 5 wt % of a fluorine compound, based on the total weight of the etchant composition;
about 0.01 wt % to about 5 wt % of an amine compound, based on the total weight of the etchant composition;
about 0.01 wt % to about 1 wt % of an alcohol compound having a hydrophilic head and a hydrophobic tail, based on the total weight of the etchant composition;
about 60 wt % to about 90 wt % of an organic solvent, based on the total weight of the etchant composition; and
a balance of water.

10. The method as claimed in claim 9, wherein:
each of the plurality of silicon films includes a single-crystal silicon film, and
a germanium content in each of the plurality of silicon germanium films is selected from a range of about 10 at % to about 20 at %.

11. The method as claimed in claim 9, wherein:
the insulating structure includes a silicon nitride film contacting a sidewall of each of the plurality of silicon films and the plurality of silicon germanium films, and
in the forming of the plurality of air gaps, the silicon nitride film is exposed by the plurality of air gaps.

12. The method as claimed in claim 9, wherein, in the etchant composition,
the oxidant includes peracetic acid, performic acid, acetic acid, formic acid, propionic acid, or a combination thereof,
the fluorine compound includes hydrofluoric acid (HF),
the amine compound includes a C1-C8 aliphatic polyamine,
the alcohol compound includes a C8-C16 alkane-1,2-diol, and
the organic solvent includes acetic acid.

13. The method as claimed in claim 9, wherein:
the etchant composition further includes about 0.01 wt % to about 5 wt % of a catalyst, based on the total weight of the etchant composition, and
the catalyst includes sulfuric acid or methanesulfonic acid.

* * * * *